United States Patent
Ma

(10) Patent No.: US 7,070,428 B2
(45) Date of Patent: Jul. 4, 2006

(54) ELECTRICAL CONNECTOR ASSEMBLY WITH PICK UP CAP

(75) Inventor: Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/001,855

(22) Filed: Dec. 1, 2004

(65) Prior Publication Data

US 2005/0136711 A1    Jun. 23, 2005

(30) Foreign Application Priority Data

Dec. 19, 2003   (TW)   ............................... 92222298 U

(51) Int. Cl.
*H01R 13/44*   (2006.01)

(52) U.S. Cl. .......................... 439/135; 439/41; 439/940
(58) Field of Classification Search .................. 439/40, 439/41, 135, 940

See application file for complete search history.

(56) References Cited

U.S. PATENT DOCUMENTS

| 5,249,977 | A | 10/1993 | Tanaka et al. |
| 5,681,174 | A | 10/1997 | Correll, Jr. et al. |
| 6,875,022 | B1 * | 4/2005 | Ma .............................. 439/41 |
| 6,877,990 | B1 * | 4/2005 | Liao et al. ..................... 439/41 |
| 6,899,553 | B1 * | 5/2005 | Ma et al. ..................... 439/135 |
| 2005/0003683 | A1 * | 1/2005 | Liao ............................. 439/41 |
| 2005/0136711 | A1 * | 6/2005 | Ma ............................ 439/135 |

* cited by examiner

*Primary Examiner*—James R. Harvey
(74) *Attorney, Agent, or Firm*—Wei Te Chung

(57) ABSTRACT

An electrical connector assembly (1) includes an LGA connector (2) and a pick up cap (3) mounted onto the connector. The connector defines a number of cells (26) for receiving a corresponding number of contacts (20).

The pick up cap mounted onto the connector has a first surface (36) engagable with a vacuum suction device and a second surface (38) having at least one protrusion (40, 42) extending downwardly therefrom, said at least one protrusion spaces the second surface of the pick up cap from a top surface (245) of the connector to form a gap (35) therebetween, thereby permitting heated air to flow therethrough during mounting the connector assembly onto the circuit substrate by SMT.

13 Claims, 3 Drawing Sheets

ELECTRICAL CONNECTOR ASSEMBLY WITH PICK UP CAP

BACKGROUND OF THE INVENTION

1. Field of the Invention

The invention is related to an electrical connector assembly which comprising a pick up cap being mounted to a electrical connector for providing a flat top surface to be engaged by a vacuum suction device.

2. Description of the Prior Art

At present, electronic components such as electrical connectors are mounted onto circuit substrates such as printed circuit boards (PCBs) by surface mount technology (SMT).

A method of mounting an electrical connector onto a PCB by SMT generally comprises a sequence of the following steps A through F:

A—Application of an adhesive film on the PCB having a plurality of metal contact pads. The application of the adhesive film may be performed by screen printing, pin transfer, or from a dispenser onto predetermined areas of the PCB.

B—Activation of the adhesive film by irradiation with actinic light in the ultraviolet (UV) or visible wavelength ranges between 200 and 600 nm, to a degree and for a period of time such that a desired initial tackiness is produced.

C—Mounting the connector with its contacts on the activated adhesive film and the metal contact pads of the PCB.

D—Curing the adhesive film at a temperature between 60~140° C.; for example, in a convection cabinet, using infrared radiant heaters or by means of the actinic radiation source used in step B if such source also produces infrared radiation.

E—Producing electrical engagement between the contacts of the connector and the corresponding metal contact pads of the PCB by soldering in a wave solder machine or in drag soldering equipment.

F—Cooling the assembly to room temperature.

In step C, the connector is accurately positioned on the PCB by a vacuum suction device. Generally, a typical connector has a plurality of holes in a flat top portion thereof. Thus the connector does not have a suitably smooth, integral top surface for engagement by a vacuum suction device. Typically, a pick up cap is attached on the top portion of the connector to provide a required plane top surface.

U.S. Pat. No. 5,681,174, discloses a pick up cap adapted to be releasably secured to a board to board electrical connector assembly for positioning the assembly to a surface of an electrical article by using a vacuum suction device. The connector assembly includes a housing having a plurality of receiving holes for receiving contacts therein. The contacts are soldered onto the surface of the electrical article. The pick up cap, which overlies at least a central region of the housing, has a plate having planar surface and at least one projection extending substantially perpendicularly from a lower surface of the pick up cap intermediate the side edge thereof to retain the pick up cap on the connector assembly during positioning of the connector assembly to the electrical article. The dimension of the board to board connector is small, and the housing is in a shape of strip, thereby the dimension of the pick up cap is correspondingly small, and only few of the receiving holes of the housing are sheltered by the pick up cap. When curing the adhesive file at high temperature, heat air can flow quickly through the receiving holes to a bottom portion of the connector assembly and reliable electrical connection is subsequently produced between the contacts of the connector and the electrical article.

However, the aforecited pick up cap is not suitable to a land grid array (LGA) connector. Generally, the dimension of this connector is large, and in a shape of square, the dimension of the pick up cap is correspondingly large, the number of the receiving holes of the housing is correspondingly large, thereby a large number of receiving holes are sheltered by the pick up cap. When curing the adhesive film at high temperature in a convention cabinet using infrared radiant heaters, heat air can only flow through a few of the receiving holes which are not sheltered by the pick up cap to a bottom portion of the housing. Generally, the time needed for curing the adhesive film is short. Thus, the adhesive film is liable to cure non-uniformly. When this happens, electrical engagement between some of the contacts and the corresponding PCB may be flawed. The connector may not reliably electrically connect with the electrical article. Additionally, when cooling the entire assembly to room temperature, heat air can only be dissipated out through the receiving holes that are not sheltered by the pick up cap. This increase the time need for cooling the assembly, which reduces the efficiency of mounting the connector onto the PCB.

For solving the above-mentioned problem, another pick up cap is provided. The pick up cap has generally rectangular vents extending through the planar body in a vertical direction thereof. When curing the adhesive film at high temperature in a convention cabinet using infrared radiant heaters, heated air can flow through the vents and get to a bottom of the connector quickly. Therefore, the connector can be reliably electrically soldered onto the PCB in a short time, and the efficiency of mounting of the connector onto the PCB is improved. However a new problem appears because of the vents in the pick up cap, dirty material is liable to adhere to the contacts of the connector through the vents, which effects performance of the contacts.

In view of the above, a new pick up cap that overcomes the above-mentioned disadvantages is desired.

SUMMARY OF THE INVENTION

An object of the invention is to provide an electrical connector assembly comprising an electrical connector and a pick up cap facilitatingly and reliably soldering the connector onto a printed circuit board (PCB).

Another object of the invention is to provide an electrical connector assembly comprising an electrical connector having a plurality of contacts and a pick up cap preventing the contacts from being polluted by outside dust.

To achieve the above-mentioned objects, an electrical connector assembly in accordance with a preferred embodiment of the present invention is provide. The electrical connector assembly comprises a land grid array (LGA) connector and a pick up cap mounted on the connector. The connector defines a number of cells for receiving a corresponding number of contacts. The pick up cap has a first surface engagable with a vacuum suction device and a second surface having at least one protrusion extending downwardly therefrom, said the protrusion spaces the second surface of the pick up cap from a top surface of the connector to form a gap therebetween, thereby permitting heated air to flow therethrough during mounting the connector assembly onto the circuit substrate by SMT. A plurality of latches are formed at sides of the pick up cap, and the latches are capable of catching the connector to mount the pick up cap on the connector.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made in detail to the preferred embodiment of the present invention.

Figure 1:
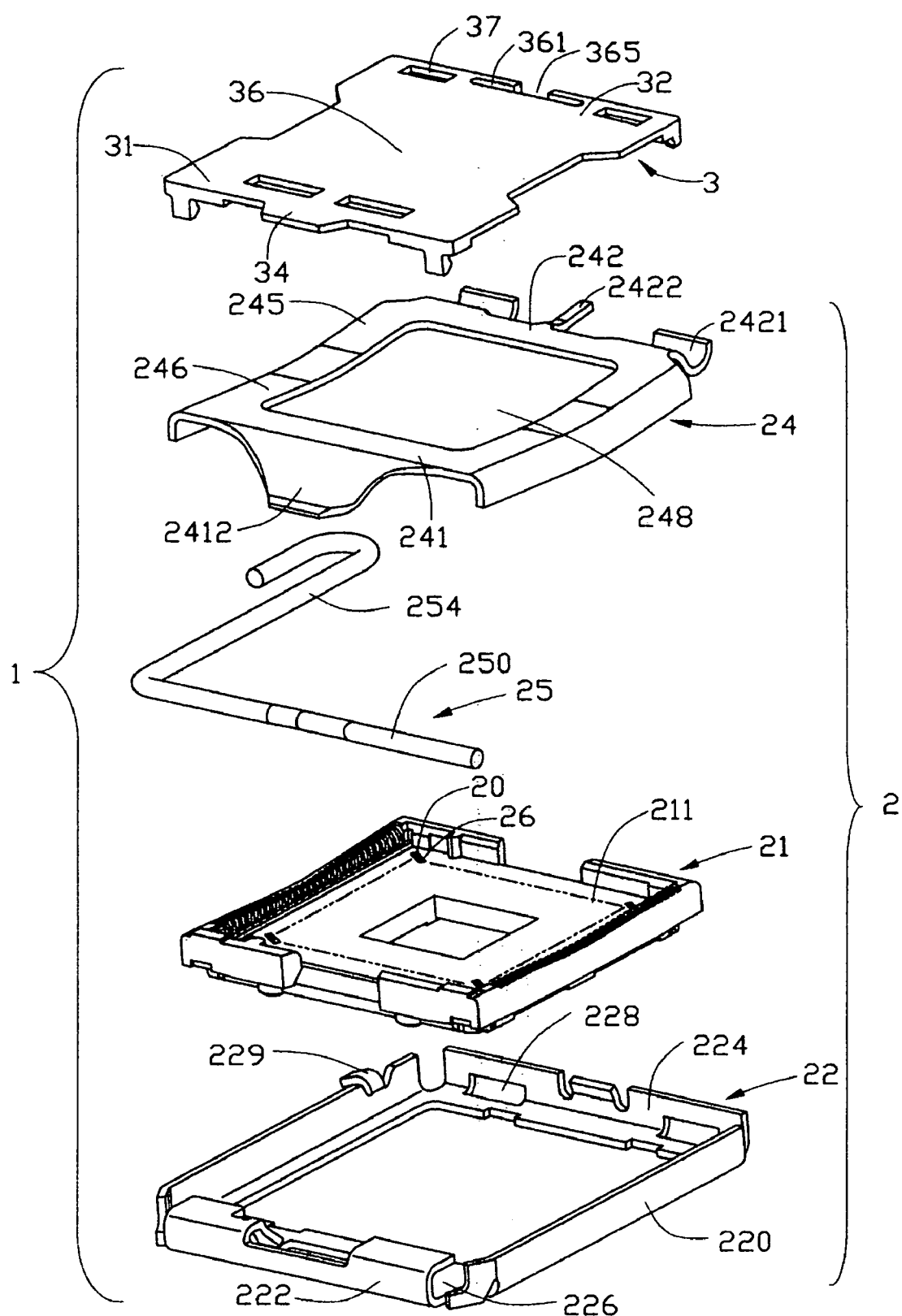
FIG. 1 is an exploded view of an electrical connector assembly in accordance with a preferred embodiment of the present invention.

Referring to FIG. 1, the electrical connector assembly 1 comprises a land grid array (LGA) connector 2 and a generally rectangular pick up cap 3. The pick up cap 3 is mounted onto the connector 2 for providing a plane top surface to be engaged with a vacuum suction device (not shown). The connector assembly 1 can thereby be moved onto a circuit substrate, such as a printed circuit board (PCB) (not shown), on which the connector 2 is to be mounted.

The connector 2 comprises a generally rectangular insulative housing 21, a plurality of electrical contacts 20 received in the housing 21, a frame 22 partly covering and reinforcing the housing 21, an operation member 25 pivotably received in the one end of the frame 22, and a load plate 24 pivotably mounted to an opposite end of the frame for engaging with the operation member 25. The housing 21 is enclosed by the load plate 24 and the frame 22.

The housing 21 defines a generally rectangular cavity 211 in a middle thereof. The cavity 211 is used for receiving an electronic package such as an LGA central processing unit (CPU) (not shown) therein. A plurality of cells 26 are defined in a portion of the housing 21 under the cavity 211 and receive a corresponding number of the contacts 20 therein respectively.

The frame 22 has a pair of lateral sides 220 each having an L-shaped cross-section, a front end 222 having a U-shaped cross-section, and a rear end 224 having an L-shaped cross-section and defining a pair of spaced slots 228. An elongate chamber 226 is formed in the front end 222 of the frame 22. The housing 21 is fittingly received in the frame 22. An ear 229 extends from an edge of one of the lateral sides 220.

The operation member 25 has a locating portion 250 received in the chamber 226 of the frame 22, and an operating portion 254 extending perpendicularly from an end of the locating portion 250. The operating portion 254 is disposed outside of the frame 22.

The load plate 24 defines a generally rectangular window 248 in the middle thereof. The load plate 24 has a frame portion (not labeled) compring a pair of parallel arcuate sides 246, a front end 241 and a rear end 241 opposite to the front end 241. The frame portion has a top surface 245. An engaging portion 2412 extends arcuately from a front end 241 of the load plate 24. A pair of spaced securing portion 2421 extends arcuately from the rear end 242 of the load plate 24, the securing portion 2421 being pivotably received in the spaced slots 228 of the frame 22. A tail 2422 extends from the rear end 242 of the load plate 24 and between the securing portions 2421. When the load plate 24 is oriented at a horizontal position parallel to a top face of the housing 21, the engaging portion 2412 of the load plate 24 is engaged with the locating portion 250 of the operation member 25, and the load plate 24 thereby pressing the CPU on the contacts 20. When the load plate 24 is in a position perpendicular to the top face of the housing 21, the tail 2422 abuts against the frame 22 to prevent the load plate 24 from over-rotating.

Figure 2:
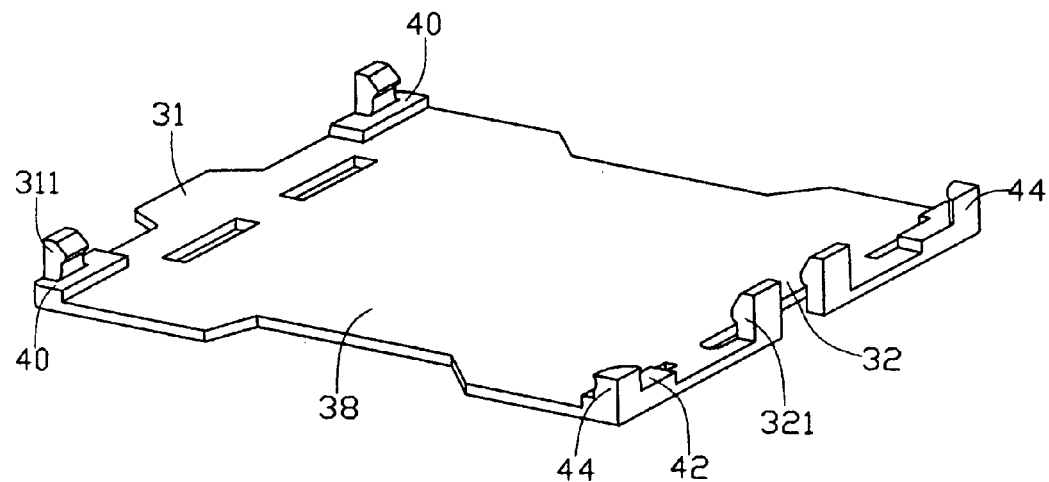
FIG. 2 is a view of a pick up cap inverted of FIG. 1.
Figure 3:
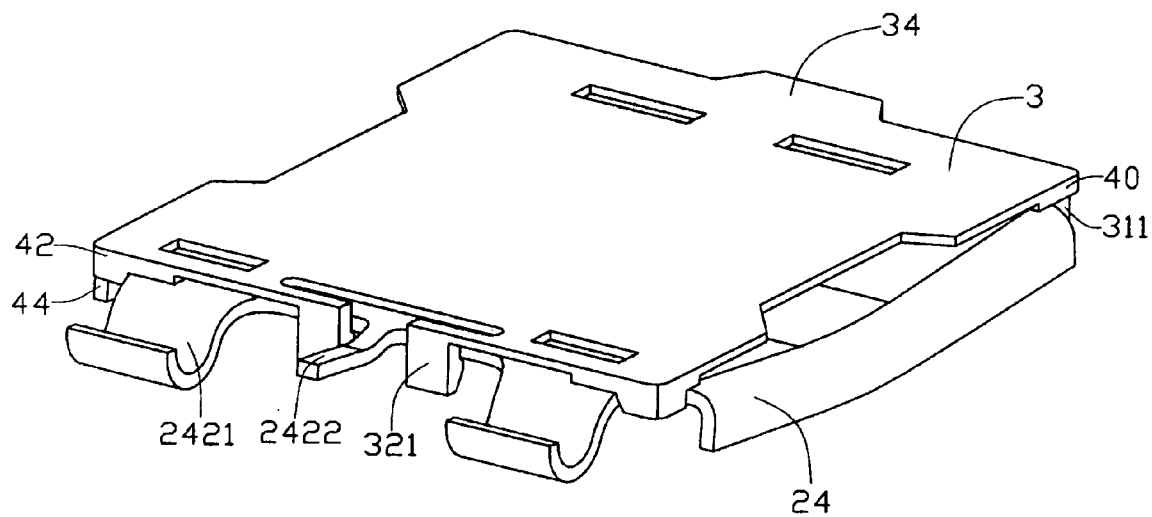
FIG. 3 is an assembly of the pick up cap and a load plate in accordance with the present invention.
Figure 4:
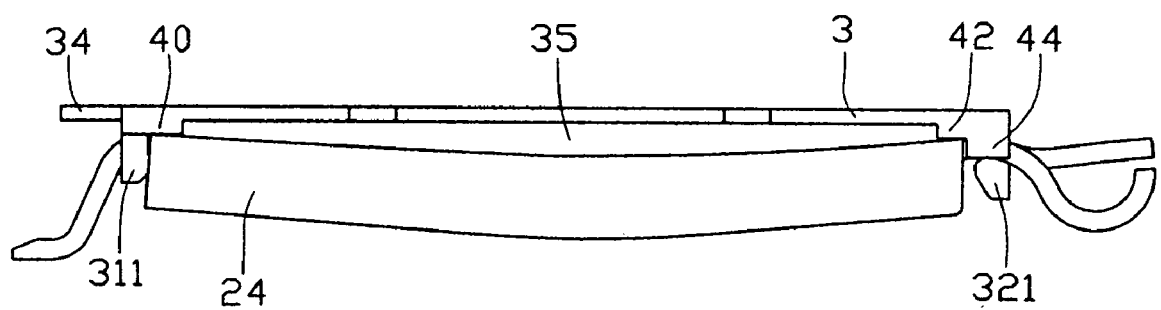
FIG. 4 is a side view of FIG. 3.

Referring FIGS. 1–2, the pick up cap 3 having a generally rectangular planar body (not shown) has a first end 31, and a second end 32 opposite to the first end 31. The planar body has a plane first surface 36 and a second surface 38 opposite to the first surface 36. When the pick up cap 3 is assembled with the load plate 24, the second surface 38 is nearer to the load plate 24 than the first surface 36, in the middle of the top surface is a complete and smooth plane for providing a surface to be engaged with a vacuum suction device and for positioning the connector assembly 1 to a desired position. A lip 34 in a shape of trapezoid extends flatly from a middle of the first end 31. Two pair of parallel through passages 37 are defined in the first end 31 and the second end 32 respectively. When pick up cap 3 is assembled with the load plate 24, the passages 37 are on the above of the front end 241 and the rear end 242 of the load plate 24, thereby preventing the contacts 20 from being polluted by dust. A generally T-shaped channel 365 is defined in a middle of the second end 32, thereby forming a pair of opposing arms 361. A pair of first protrusions 40 extending perpendicularly downwardly from the second surface 38 are formed at the opposite sides of the first end 31. A pair of first latches 311 are formed on the first protrusions 40 respectively. A pair of second protrusions 42 extending perpendicularly downwardly from the bottom surface 38 at the opposite sides of the second end 32, and a pair of locating posts 44 extend downwardly from the second protrusions 42 respectively, near corresponding corners of the planar body of the pick up cap 3. A pair of second latches 321 extending perpendicularly downwardly from free ends of the arms 361 respectively is for snappingly clasping the rear end of the load plate 24.

Referring to FIG. 1–FIG. 4, in attachment of the pick up cap 3 onto the connector 2, the pick up cap 3 is over the connector 2, with the first and the second latches 311, 321 loosely contacting corresponding edges of front and rear end of the load plate 24 respectively. The pick up cap 3 is pressed down, the first protrusions 40 and second protrusions 42 against the top surface 245 of the fame portion of the load plate 24, and the first latches 311 and second latches 321 are elastically deflected outwardly, and snappingly clasp the front and the rear edges of the load plate 24. Simultaneously, the locating posts 44 are abutting against the rear edges of the load plate 24 to prevent the pick up cap 3 from moving horizontally relative to the load plate 24. The pick up cap 3 is thereby securely mounted onto the connector 2. The channel 365 receives the tail 2422 of the load plate 24. The connector 2 is thereby assembled with the pick up cap 3, viewing as the FIG. 3 and FIG. 4. Because the first and second protrusions 40, 42 against the top surface 245 of the frame portion of the load plate 24, a big gap 35 is formed between the second surface 38 of the pick up cap 3 and the top surface 245 of the frame portion of the load plate 24. Thereby the passages 37 of the pick up cap 3 can communicate with the window 248 of the load plate 24 and the cells 26 of the housing 21 through the gap 35. In this position, a vacuum suction device (not shown) can reliably engage a middle portion of the first surface 36 of the pick up cap 3. The connector assembly 1 can thus be moved to a desired location on the PCB, with the contacts 20 of the connector 2 engaging on an activated adhesive film and metal contact pads of the PCB.

The adhesive film is cured at a high temperature in a convention cabinet using infrared radiant heaters. Heated air can flow not only through the gap 35, but also through the passages 37 of the pick up cap 3, the window 248 of the load plate 24, and the cells 20 of the housing 21. Thus, much heated air can quickly flow to a bottom portion of the connector 2, and quickly and uniformly cure the adhesive film. Accordingly, when the entire assembly is subsequently processed in a wave solder machine or drag soldering equipment, reliable electrical connection between the contacts 20 of the connector 2 and the metal contact pads of the PCB is produced. Furthermore, when said entire assembly 1 is cooled, heated air can be quickly disspated out through the passages 37 and the gap 35, thereby the entire assembly 1 can be cooled quickly. The efficiency of mounting of connector 2 onto the PCB is thereby enhanced.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. An electrical connector assembly comprising:
   an electrical connector for being mounted onto a circuit substrate by surface mount technology(SMT); and
   a pick up cap mounted onto the connector and having a first surface engagable with a vacuum suction device and a second surface, opposite to the first surface, having at least one protrusion extending downwardly therefrom, said at least one protrusion spacing the second surface of the pick up cap from a top surface of the connector to form a gap therebetween under a condition that said second surface is not engaged with any portions of said top surface of the connector, thereby permitting heated air to flow therethrough during mounting the connector assembly onto the circuit substrate by SMT;
   wherein the pick up cap comprises at least one passage there through;
   wherein the pick up cap comprises a first end and a second end opposite to the first end, and a pair of first latches are formed at the first end and a pair of second latches are formed at the second end;
   wherein the pick up cap has a pair of first protrusions and a pair of second protrusions formed at the first end and the second end respectively.

2. The electrical connector assembly in accordance with claim 1, wherein the protrusion is formed at an end of the pick up cap.

3. The electrical connector assembly in accordance with claim 1, wherein the first latches are formed on the first protrusions respectively.

4. The electrical connector assembly in accordance with claim 1, wherein the second end comprises a T-shaped channel in a middle thereof, thereby forming a pair of opposing arms, the second latches extending from free ends of the arms respectively for snappingly clasping a corresponding position of the connector.

5. The electrical connector assembly in accordance with claim 1, wherein the connector comprises a load plate having a frame portion and a generally rectangular window in a middle thereof, and the passage is above the frame and communicates with the window through the gap.

6. The electrical connector assembly in accordance with claim 5, wherein the connector comprise a housing having a plurality of contacts therein, a frame partly covering and reinforcing the housing, an operation member pivotably received in one end of the frame, and the load plate pivotably mounted to an opposite end of the frame for engaging with the operation member, the contacts are mounted to the circuit substrate by SMT, the housing is enclosed by the load plate and the frame.

7. The electrical connector assembly in accordance with claim 6, wherein the frame has a front end having a U-shaped cross-section, an elongate chamber is formed in the front end, the operation member has a locating portion extending perpendicularly from an end of the locating portion and received in the chamber, and an operation portion disposed outside of the frame.

8. The electrical connector assembly in accordance with claim 7, wherein the frame portion of the load plate comprises a pair of parallel arcuate sides, a front end and a rear end opposite the front end, an engaging portion extends arcuatedly from the front end and engages with locating portion of the operation member.

9. The electrical connector assembly in accordance with claim 8, wherein the frame has a rear end having an L-shaped cross-section and defining a pair of spaced slots, the load plate has a pair of securing portion extending from a rear end thereof and being pivotably received in the spaced slots.

10. The electrical connector assembly in accordance with claim 9, wherein the load plate comprises a tail extending from the rear end and between the securing portions.

11. A pick up cap adapted to be mounted onto a connector for providing a first surface engagable with a vacuum suction device, comprising:
    a planar body comprising a second surface opposite to the first surface, at least one protrusion formed at the second surface, and a large gap formed between the connector and the pick up cap while the protrusion being against a top surface of the connector under a condition that the second surface is not engaged with any portions of the top surface; and
    a plurality of latches formed at sides of the planar body, the latches capable of catching the connector to mount the pick up cap on the connector;
    wherein the planar body comprises a first end and a second end opposite to the first end, and a pair of first latches are formed at the first end and a pair of second latches are formed at the second end;
    wherein two pair of protrusions perpendicularly downwardly extend from the second surface of the pick up cap and are formed at the first end and the second end respectively.

12. The pick up cap in accordance with claim 11, wherein the planar body defines at least one passage therethrough.

13. The pick up cap in accordance with claim 11, wherein the protrusion extending perpendicularly downwardly from the second surface of the pick up cap is formed at an end of the pick up cap.

* * * * *